(12) United States Patent
Chiu

(10) Patent No.: US 7,768,306 B2
(45) Date of Patent: Aug. 3, 2010

(54) LOW TO HIGH VOLTAGE CONVERSION OUTPUT DRIVER

(75) Inventor: Pao-Cheng Chiu, Taipei Hsien (TW)

(73) Assignee: Mediatek Inc., Hsin-Chu (TW)

( * ) Notice: Subject to any disclaimer, the term of this patent is extended or adjusted under 35 U.S.C. 154(b) by 129 days.

(21) Appl. No.: 11/533,378

(22) Filed: Sep. 20, 2006

(65) Prior Publication Data
US 2008/0068043 A1 Mar. 20, 2008

(51) Int. Cl.
*H03K 19/0175* (2006.01)
*H03L 5/00* (2006.01)
*G06F 13/12* (2006.01)

(52) U.S. Cl. .................. 326/68; 326/112; 326/115; 327/333; 710/71

(58) Field of Classification Search .......... 326/68, 326/81, 115, 112, 121, 127; 327/333
See application file for complete search history.

(56) References Cited

U.S. PATENT DOCUMENTS

| | | | |
|---|---|---|---|
| 4,313,176 A | 1/1982 | Cecil | |
| 5,656,952 A | 8/1997 | McCall et al. | |
| 5,675,584 A | 10/1997 | Jeong | |
| 5,751,179 A | 5/1998 | Pietruszynski et al. | |
| 5,798,658 A | 8/1998 | Werking | |
| 6,134,247 A | 10/2000 | Solana de Quesada | |
| 6,211,714 B1 | 4/2001 | Jeong | |
| 6,771,194 B2 | 8/2004 | Shi | |
| 7,088,149 B2* | 8/2006 | Udupa et al. ................. 327/96 |
| 7,199,619 B2 | 4/2007 | Tam | |
| 7,203,460 B2 | 4/2007 | Boose et al. | |
| 7,222,290 B2 | 5/2007 | Guo et al. | |
| 7,245,240 B1 | 7/2007 | Nguyen et al. | |
| 7,342,977 B2 | 3/2008 | Jenkins et al. | |
| 7,471,107 B1 | 12/2008 | Fortin et al. | |
| 2003/0193362 A1* | 10/2003 | Kobayashi ................. 327/333 |
| 2005/0116760 A1 | 6/2005 | Udupa et al. | |
| 2006/0061391 A1* | 3/2006 | Tam ........................... 326/115 |
| 2007/0232246 A1* | 10/2007 | Lozhkin et al. ............. 455/108 |

FOREIGN PATENT DOCUMENTS

| | | |
|---|---|---|
| CN | 1251966 A | 3/2000 |
| EP | 1001346 A2 | 5/2000 |

OTHER PUBLICATIONS

China Office Action mailed Jul. 3, 2009.
Office Action mailed on May 14, 2009, in divisional U.S. Appl. No. 12/120,520.

* cited by examiner

*Primary Examiner*—Vibol Tan
(74) *Attorney, Agent, or Firm*—Thomas, Kayden, Horstemeyer & Risley

(57) ABSTRACT

A low to high voltage conversion output driver. The low to high voltage conversion output driver has an output coupled to a first fixed voltage via a load device and comprises a current source, a low voltage transistor, and a high voltage transistor. The current source has one end coupled to a second fixed voltage. The low voltage transistor has a first terminal coupled to the other end of the current source, a second terminal receiving a low voltage data signal, and a third terminal. The high voltage transistor has a first terminal coupled to the third terminal of the low voltage transistor, a second terminal coupled to a bias source, and a third terminal coupled to the output.

12 Claims, 7 Drawing Sheets

LOW TO HIGH VOLTAGE CONVERSION OUTPUT DRIVER

BACKGROUND OF THE INVENTION

1. Field of the Invention

The invention relates to parallel to serial data transmission and, in particular, to a parallel to serial transmitter with a low to high voltage conversion output driver.

2. Description of the Related Art

In computing, bit serial transmission is the transmission of several bits one after another, with all the bits transmitted over a single wire. If operating at the same clock speed, a serial channel is slower than a parallel channel. Modern computer bus technology (e.g. S-ATA, USB) often uses serial transmission since serial digital circuits are easier to design and clock speed can be increased to make up for lower efficiency. As a result, to accomplish high speed data communication, parallel to serial transmission is often used to transform low speed parallel input data to high speed serial data.

BRIEF SUMMARY OF THE INVENTION

An embodiment of a low to high voltage conversion output driver comprises a current source, a low voltage transistor, and a high voltage transistor. The current source has one end coupled to a second fixed voltage. The low voltage transistor has a first terminal coupled to the other end of the current source, a second terminal receiving a low voltage data signal, and a third terminal. The high voltage transistor has a first terminal coupled to the third terminal of the low voltage transistor, a second terminal coupled to a bias source, and a third terminal coupled to an output of the low to high voltage conversion output driver. The output of the low to high voltage conversion output driver is coupled to a first fixed voltage via a load device.

Another embodiment of a parallel to serial transmitter comprises a parallel to serial converter, and a low to high voltage conversion output driver. The parallel to serial converter receives a parallel data signal and generates a low voltage serial data signal. The low to high voltage conversion output driver receives and converts the low voltage serial data signal to a high voltage serial data output signal.

An embodiment of a low to high voltage signal conversion method comprises providing a low voltage serial data signal to a low voltage transistor, providing a bias voltage to a high voltage transistor, and sourcing a current from the low voltage transistor. The current flows through a load device, the high voltage transistor, and the low voltage transistor.

The invention provides a low to high voltage conversion output driver whereby low voltage serial data is converted to high voltage without a level shifter. The low to high voltage conversion output driver is driven by a low voltage serial data signal and generates a high voltage serial data signal to a high voltage communication channel. Thus, chip area and power consumption of the level shifter are eliminated, as is timing jitter due to limited bandwidth of the level shifter.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
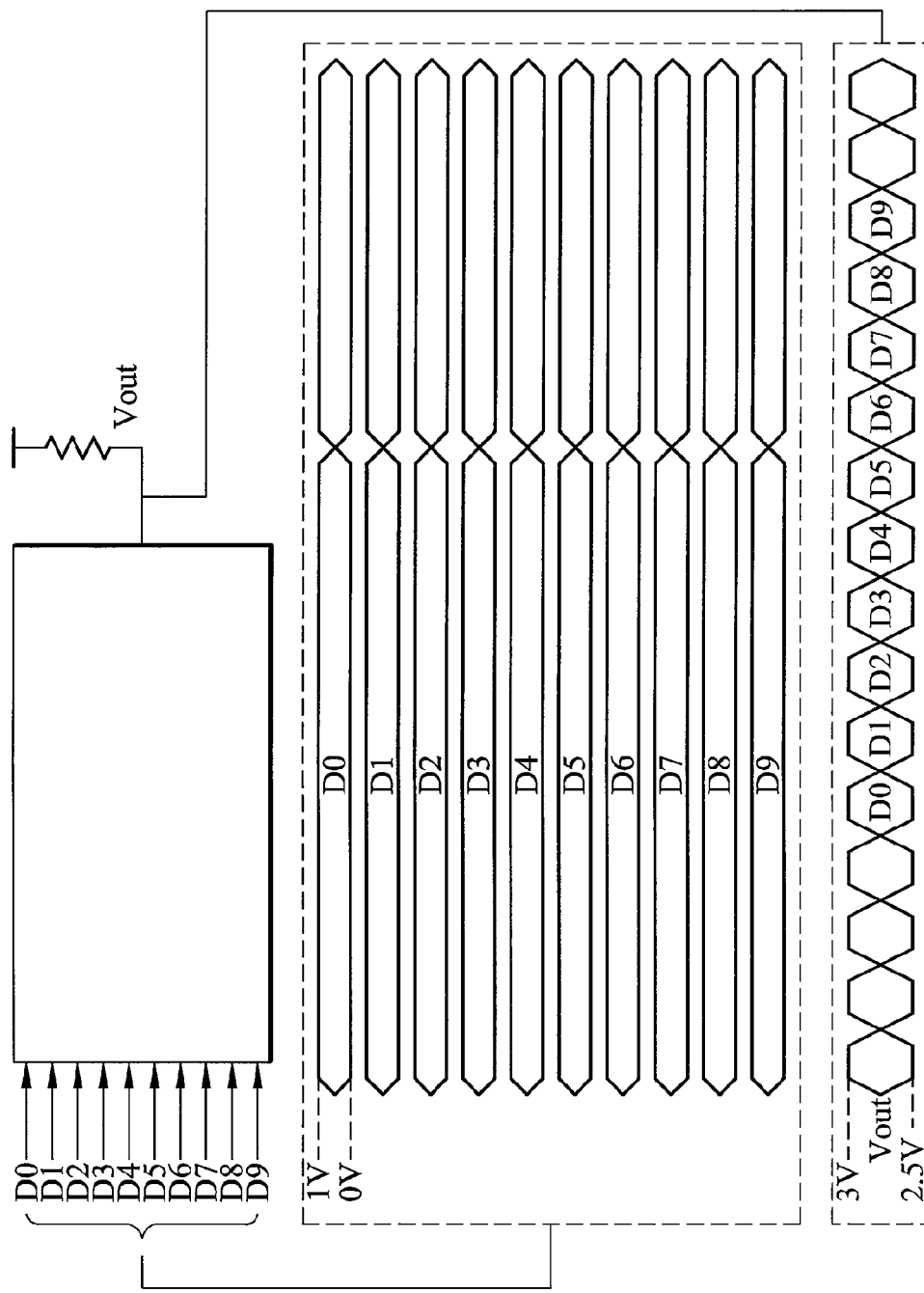
FIG. 1 is a block diagram of a parallel to serial transmitter.

FIG. 1 is a block diagram of a parallel to serial transmitter. As shown in FIG. 1, a 10-bit parallel input data signal D0~D9 of 0V/1V at 100 MHz is transformed to a 1-bit serial output data signal Vout of 2.5V/3V at 1 GHz. High speed data throughput is accomplished by simply using one channel and two voltage levels.

The ultimate goal of parallel to serial transmission is to transmit high speed serial data via a single communication channel. When voltage of internal serial data is different from that of the communication channel, an interface is required to accomplish voltage conversion between signals of different levels. A voltage level shifter or voltage converter increases chip cost and degrades signal integrity depending on arrangement thereof in circuit architecture.

Figure 2:
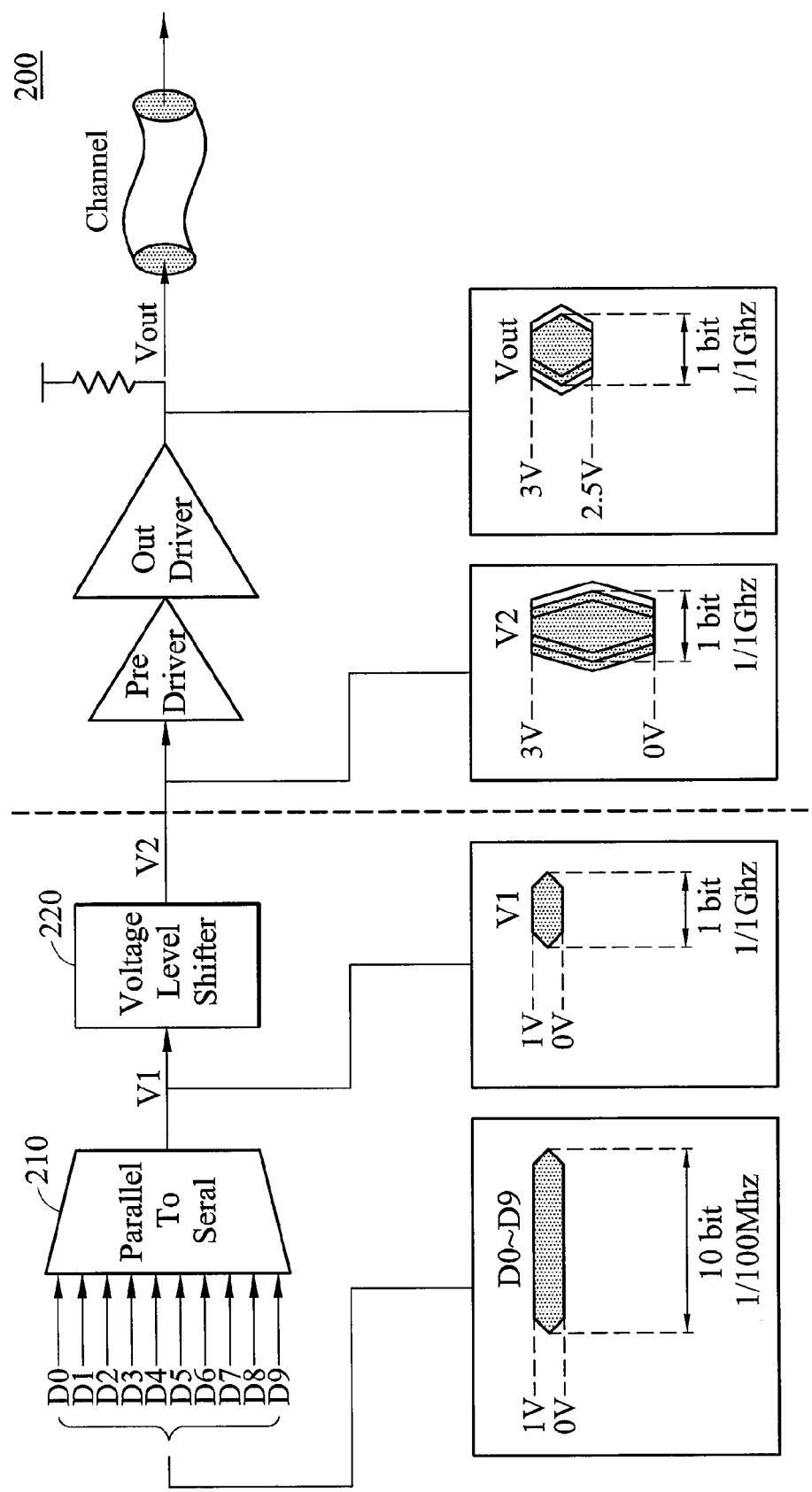
FIG. 2 is a block diagram of a parallel to serial transmitter, wherein a parallel to serial converter is followed by a voltage level shifter.

Slow speed (or limited bandwidth) is a well-known drawback of a voltage level shifter 200. As shown in FIG. 2, a parallel to serial converter 210 is followed by a voltage level shifter 220. The single voltage level shifter 220 shifts voltage level of a 1-bit high speed serial data signal V1. Due to limited width of the voltage level shifter 220 and random nature of the high speed serial data signal, timing dispersion of signal pulses occurs, resulting in inter symbol interference (ISI). ISI leads to timing jitter of an output signal after passing a logic circuit and thus bit error rate (BER) of a receiver is degraded.

Figure 3:
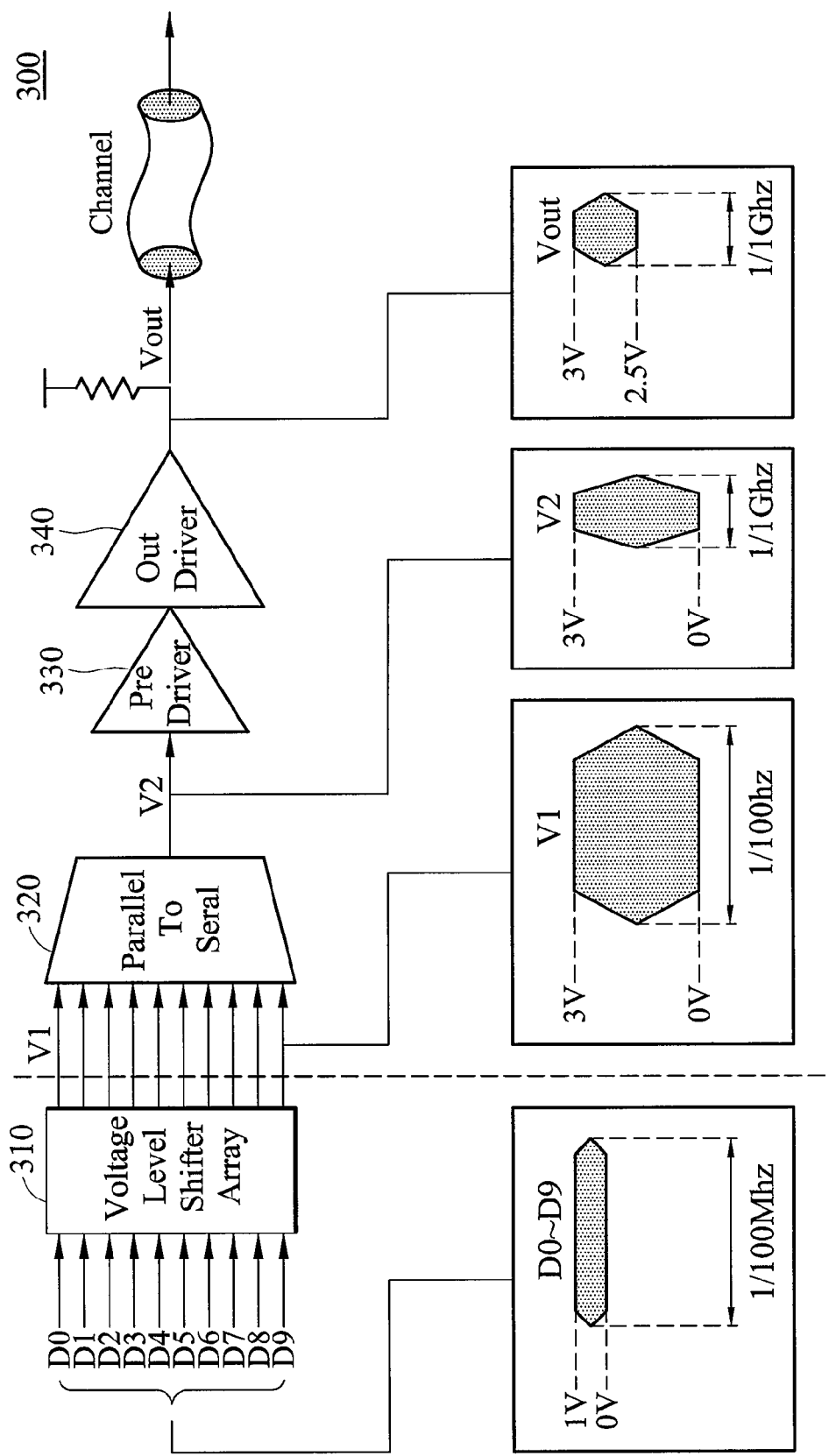
FIG. 3 is a block diagram of a parallel to serial transmitter, wherein a voltage level shifter array is followed by a parallel to serial converter.

As shown in FIG. 3, a voltage level shifter array 310 is followed by a parallel to serial converter 320. The circuit architecture does not require a high speed voltage level shifter but a large number of voltage level shifters. Since voltage level of a parallel data signal is shifted to high voltage after the voltage level shifter array 310, the parallel to serial converter 320, a pre-driver 330, and an output driver 340 following the voltage level shifter array 310 require high voltage transistors. In high voltage technology, the transistors typically require large area and exhibit low speeds, leading to increased cost and power consumption. In FIG. 3, a 10-bit parallel data signal D0~D9 at 100 Mhz requires ten voltage level shifters, and the following pre-driver 330 and output driver 340 receiving a 1-bit high voltage serial data signal at 1 GHz require high voltage circuits. The high voltage circuits increase area and power consumption and low speed thereof also limits transmission bandwidth of the entire circuit architecture, leading to difficulties in circuit design.

Figure 4:
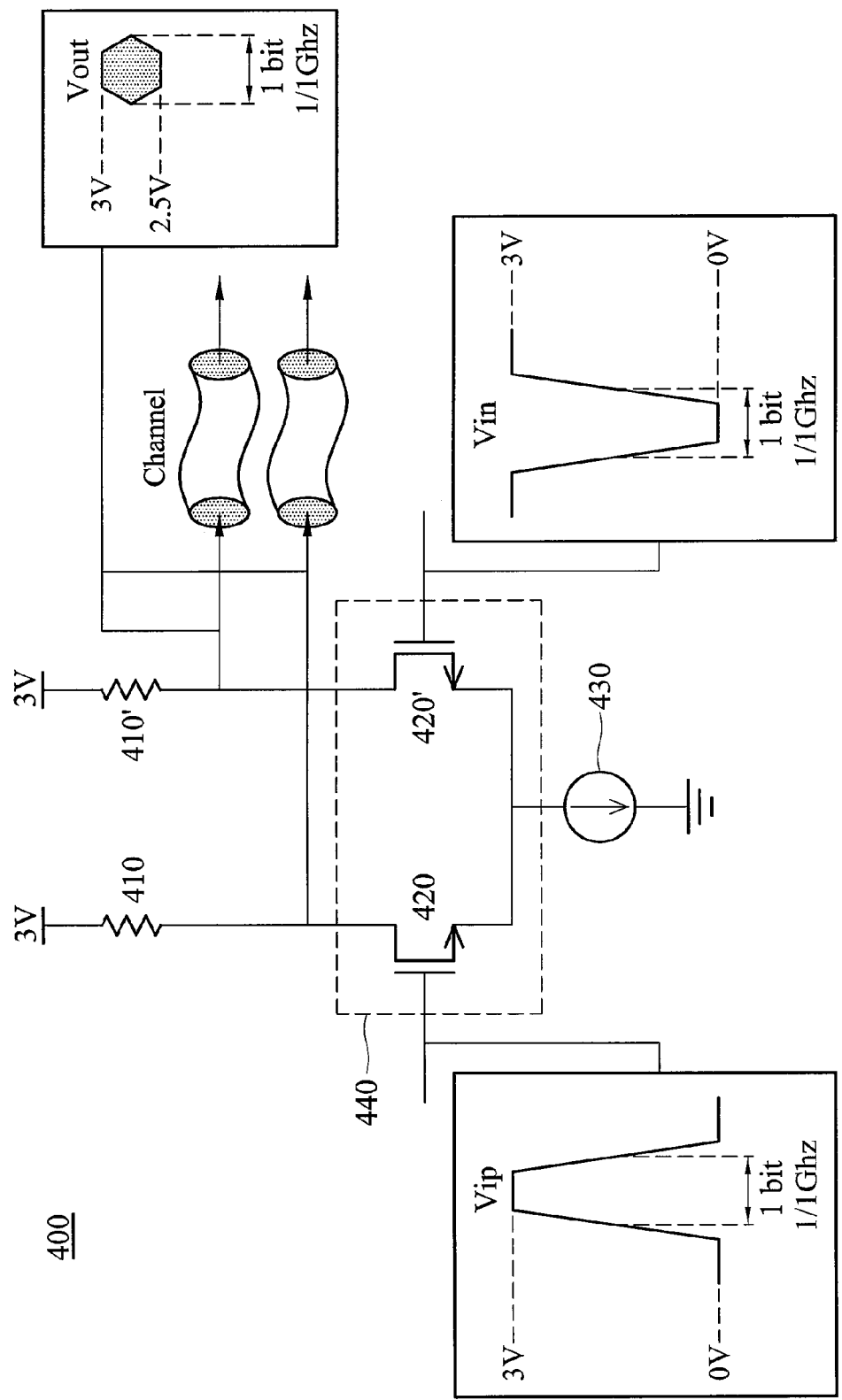
FIG. 4 is a circuit diagram of a output driver in a parallel to serial transmitter.

FIG. 4 is a circuit diagram of an output driver 400 in a parallel to serial transmitter. The output driver 400 comprises a resistor pair 410 and 410', a NMOS differential pair 440, and a current source 430. The current source 430 provides current through the resistor pair 410 and 410' such that an output signal Vout with a voltage swing complying with a specification is obtained. A 1-bit 1 GHz serial data signal Vip and Vin ranging from 0-3V modulates the current through the resistor pair 410 and 410' via controlling the NMOS differential pair 440. Eventually, the high speed serial data is converted to the output signal Vout with the voltage swing complying with the specification and the output signal Vout is provided to an output channel. Since the highest voltage of the output signal Vout is 3V, the NMOS transistors 420 and 420' in the NMOS differential pair 440 have to be high voltage transistors in order that the transistors can tolerate high voltage stress. If the NMOS transistors 420 and 420' in the NMOS differential pair 440 are low voltage transistors, the high voltage of the output signal Vout directly stresses the low voltage transistors, resulting in poor reliability and shortened lifetime.

Figure 5:
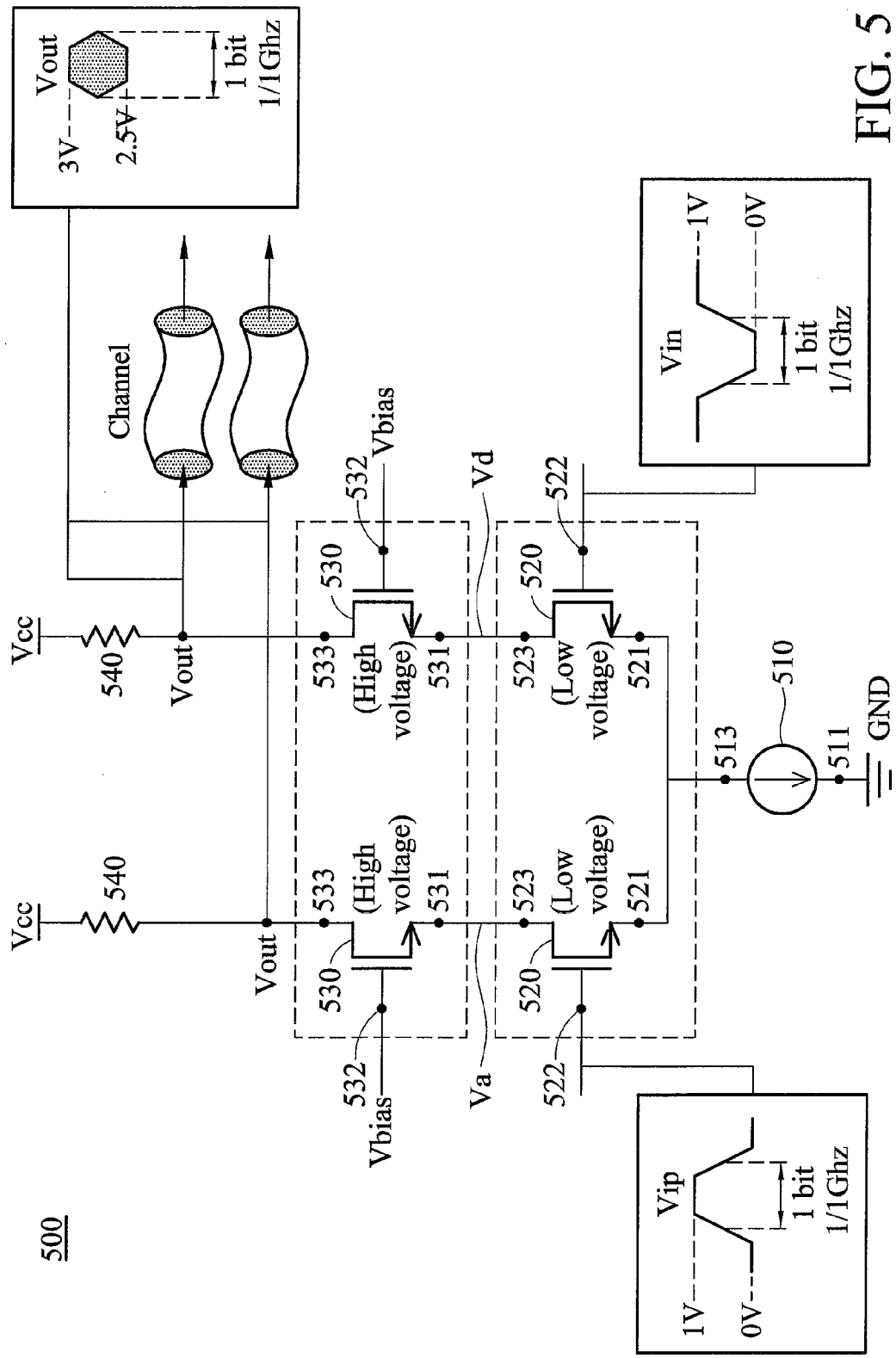
FIG. 5 is a circuit diagram of a low to high voltage conversion output driver according to an embodiment of the invention.
Figure 7:
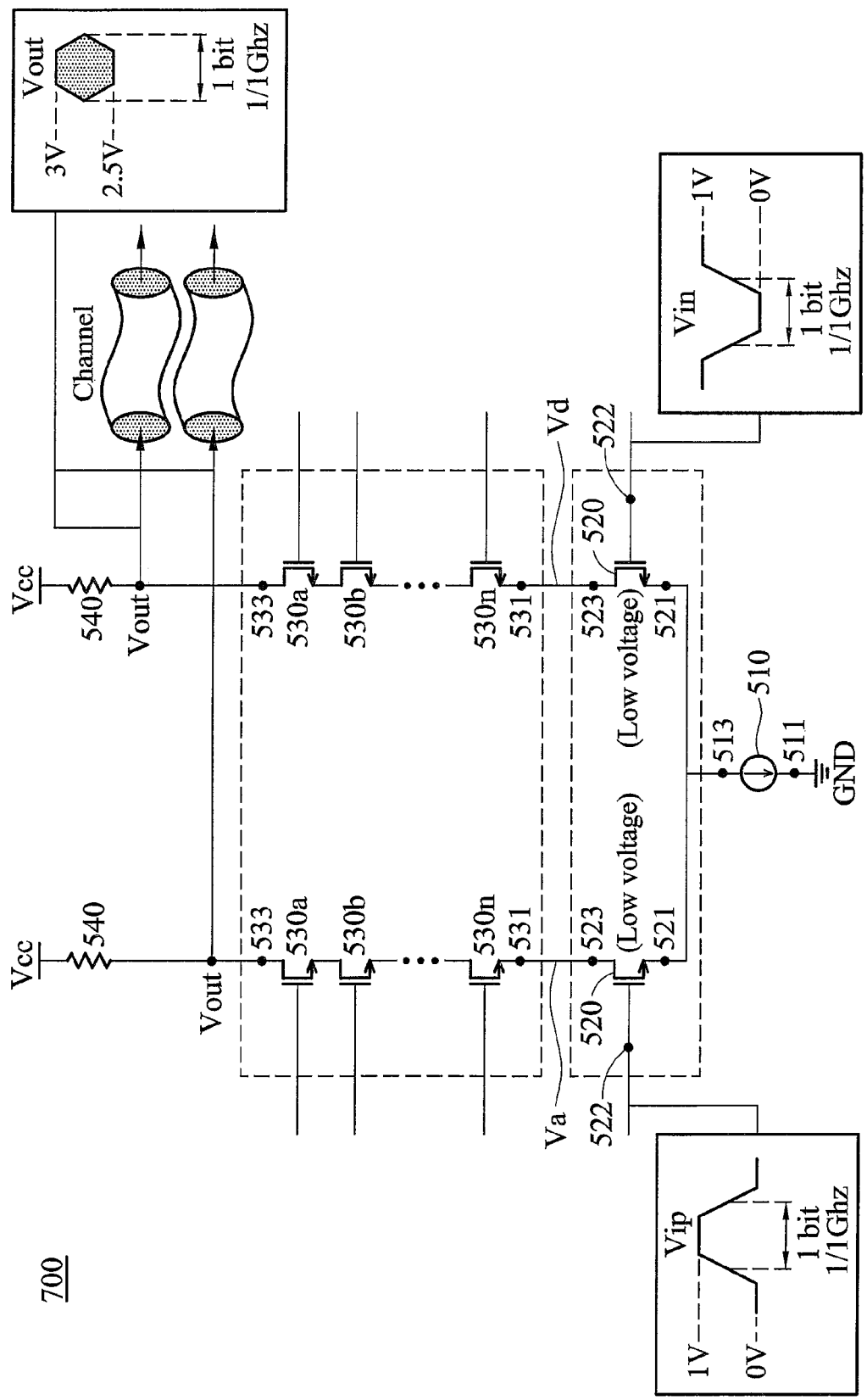
FIG. 7 shows a diagram of cascaded-connected low voltage transistors.

FIG. 5 is a circuit diagram of a low to high voltage conversion output driver 500 according to an embodiment of the invention. An output Vout of the low to high voltage conversion output driver 500 is coupled to a first fixed voltage via a load device 540. More specifically, the first fixed voltage is a power voltage Vcc. The voltage value of Vcc depends on the requirement of the channel connected to Vout. Typically, Vcc could be approximately 3 Volt. The low to high voltage conversion output driver 500 comprises a current source 510, a low voltage transistor 520, and a high voltage transistor 530. The current source 510 has one end 511 coupled to a second fixed voltage. More specifically, the second fixed voltage is a ground GND. The low voltage transistor 520 has a first terminal 521 coupled to the other end 513 of the current source 510, a second terminal 522 receiving a low voltage data signal Vip and Vin, and a third terminal 523. The high voltage transistor 530 has a first terminal 531 coupled to the third terminal 523 of the low voltage transistor 520, a second terminal 532 coupled to a bias source Vbias, and a third terminal 533 coupled to the output Vout of the low to high voltage conversion output driver 500. Preferably, the low voltage transistors 520 and high voltage transistors 530 are NMOS transistors. The first, second, and third terminals thereof are respectively sources, gates, and drains. In addition, the bias source is a voltage source. In another embodiment, the transistor 530 need not be a high voltage device. Multiple low voltage transistors 530 can be cascaded-connected to the transistor 520, as the low voltage transistors 530a, 530b, ... and 530n shown in FIG. 7, to make sure that Vout is in a proper voltage range (for example, 2.5 to 3 Volt in the embodiment of FIG. 5). The channel is, for example, a serial link. A serial link can be, for example, a USB, PCI Express, SATA, or HDMI interface.

In FIG. 5, high voltage transistors 530 are cascaded with low voltage transistors 520 to protect the low voltage transistors 520 from high voltage stress. The high voltage transistors 530 are biased at a bias voltage such that the high voltage transistors 530 operate in a saturation region when turned on. In addition, the circuit can be designed to keep voltages Va and Vb sustainable by the low voltage transistors 520 such that the low voltage transistors 520 are not damaged by high voltage. Threshold voltage of the low voltage transistors 520, 0.3V in 0.13 μm CMOS technology for example, is low and the low voltage transistors 520 can be directly driven by the low voltage serial data signal Vip and Vin, with a high state of 1V for example. In such a way, it is avoided to drive low speed high voltage transistors with a high speed data signal. One advantage of using the output driver 500 is that no high voltage (3 Volt in this embodiment) is needed to be inputted into a chip because the load device 540 can be implemented outside the chip and the control voltage of the transistor 522 (used by the chip) is a low voltage (1 Volt in this embodiment). In recent development, digital circuit employs core devices to get higher speed and smaller chip area. A core device usually has a lower threshold voltage (Vt) than a standard or traditional device. However, the output of a digital circuit sometimes has to drive a high voltage interface, such as a serial link mentioned above.

It is noted that although the low to high voltage conversion output driver 500 in FIG. 5 is a differential circuit, the scope of the invention is not limited thereto. Single ended circuits are also applicable, as will be recognized by those skilled in the art.

Figure 6:
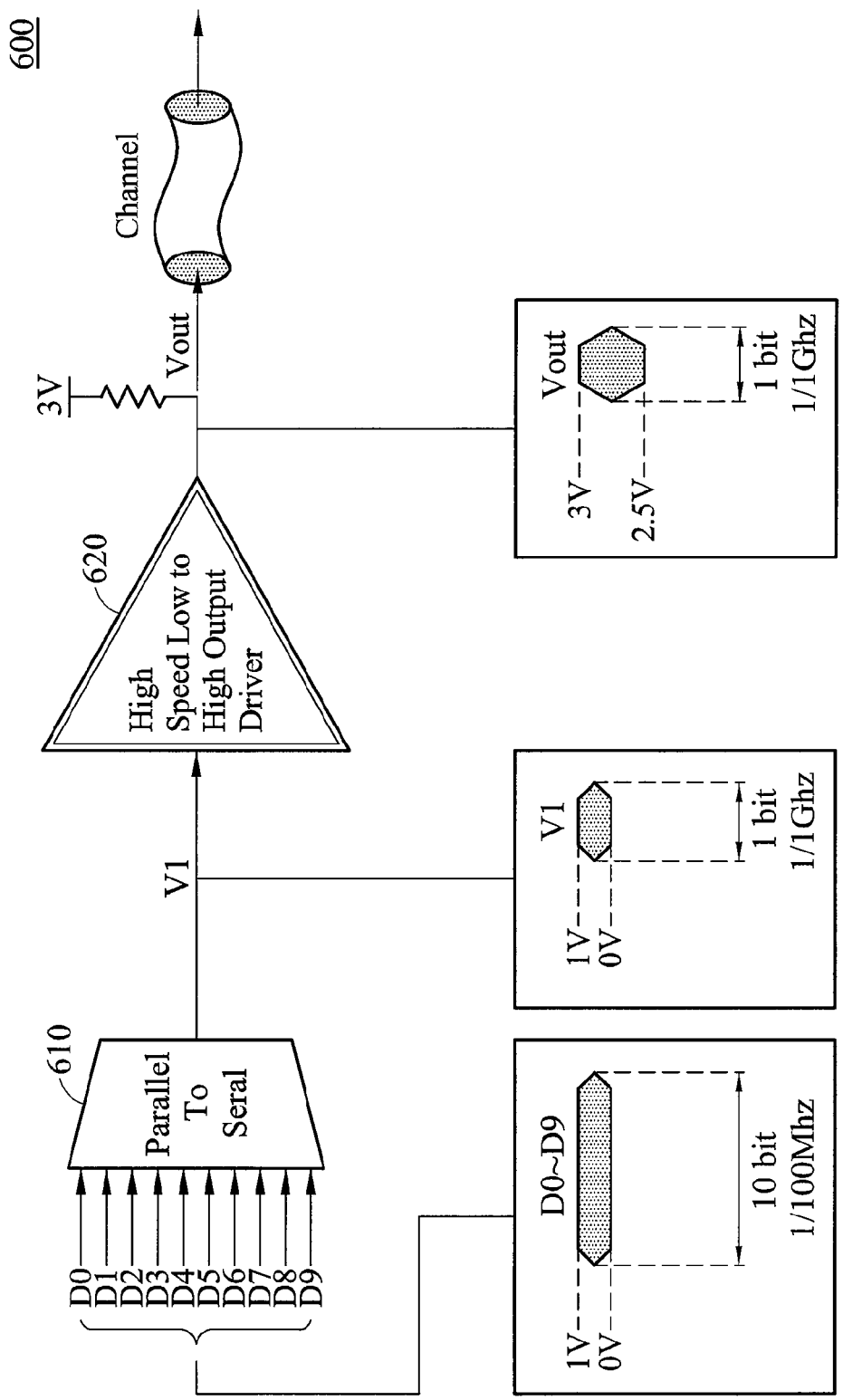
FIG. 6 is a block diagram of a parallel to serial transmitter according to an embodiment of the invention.

FIG. 6 is a block diagram of a parallel to serial transmitter 600 according to an embodiment of the invention. The parallel to serial transmitter 600 comprises a parallel to serial converter 610, and a low to high voltage conversion output driver 620. The parallel to serial converter 610 receives a parallel data signal D0~D9 and generates a low voltage serial data signal V1. The low to high voltage conversion output driver 620 receives and converts the low voltage serial data signal V1 to a high voltage serial data output signal Vout. Preferably, the low to high voltage conversion output driver is implemented as previously disclosed.

In FIG. 6, the low to high voltage conversion output driver 620 replaces a conventional high voltage output buffer in a conventional parallel to serial transmitter. No low to high voltage level shifter is required. In addition, the high speed data signal is kept at a low voltage domain before output to a communication channel. The low to high voltage conversion output driver is directly driven by a low voltage serial data signal and no additional intermediate circuit is required. In such design, high current driving capability of low voltage transistors can be fully exploited. In addition, occupied area of the parallel to serial transmitter is smaller, operating bandwidth thereof is higher, and power consumption thereof is lower.

The invention also provides a low to high voltage signal conversion method. The method comprises providing a low voltage serial data signal to a low voltage transistor, providing a bias voltage to a high voltage transistor, and sourcing a current from the low voltage transistor. The current flows through a load device, the high voltage transistor, and the low voltage transistor.

The invention provides a low to high voltage conversion output driver whereby a low voltage serial data is converted to high voltage without a level shifter. The low to high voltage conversion output driver is driven by a low voltage serial data signal and generates a high voltage serial data signal to a high voltage communication channel. Thus, chip area and power consumption of the level shifter are eliminated, as is timing jitter due to limited bandwidth of the level shifter.

While the invention has been described by way of example and in terms of preferred embodiment, it is to be understood that the invention is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A parallel to serial transmitter comprising:
   a low to high voltage conversion output driver, comprising:
   a current source having one end coupled to a fixed voltage;
   a low voltage transistor having a first terminal coupled to the other end of the current source, a second terminal receiving a low voltage data signal, and a third terminal; and
   a high voltage transistor having a first terminal coupled to the third terminal of the low voltage transistor, a second terminal coupled to a bias voltage, and a third terminal coupled to an output for outputting a high voltage data signal; and
   a parallel to serial converter coupled to the low to high voltage conversion output driver and providing the low voltage data signal thereto;
   wherein the low voltage data signal is with a speed higher than that of a plurality of input parallel data signal of the parallel to serial converter.

2. The parallel to serial transmitter as claimed in claim 1, wherein the second fixed voltage is a ground.

3. The parallel to serial transmitter as claimed in claim 1, wherein the low and high voltage transistors are NMOS transistors, the first, second, and third terminals thereof are respectively sources, gates, and drains, and the bias voltage source is a voltage source.

4. The parallel to serial transmitter as claimed in claim 1, further comprising:
   a plurality of transistors cascoded-connected to the low voltage transistor.

5. The parallel to serial transmitter as claimed in claim 1, wherein the high voltage transistor operates in a saturation region when being turned on.

6. The parallel to serial transmitter as claimed in claim 1, wherein the data speed of the high voltage data signal is high enough for USB, PCI Express, SATA, or HDMI interface.

7. The parallel to serial transmitter as claimed in claim 1, wherein the low voltage transistor is a core device.

8. A low to high voltage signal conversion method, comprising:
   providing a low voltage serial data signal to a low voltage transistor;
   providing a bias voltage to a high voltage transistor; and
   sourcing a current from the low voltage transistor to generate a high voltage data signal at one terminal of the high voltage transistor;
   wherein the low voltage serial data signal is provided by a parallel to serial converter and is with a speed higher than that of a plurality of input parallel data signal of the parallel to serial converter.

9. The low to high voltage signal conversion method as claimed in claim 8, wherein the high voltage data signal is outputted to USB, PCI Express, SATA, or HDMI interface.

10. The low to high voltage signal conversion method as claimed in claim 8, wherein the low voltage transistor is a core device.

11. A parallel to serial transmitter, comprising:
    a low to high voltage conversion output driver having an output coupled to a first fixed voltage via a load device and comprising:
    a current source having one end coupled to a second fixed voltage;
    a low voltage transistor having a first terminal coupled to the other end of the current source, a second terminal receiving a low voltage data signal, and a third terminal; and
    a high voltage transistor having a first terminal coupled to the third terminal of the low voltage transistor, a second terminal coupled to a bias source, and a third terminal coupled to the output, wherein the high voltage transistor is capable of tolerating higher voltage value between any two terminals of the high voltage transistor than the low voltage transistor; and
    a parallel to serial converter coupled to the low to high voltage conversion output driver and providing the low voltage data signal thereto,
    wherein the low voltage data signal is with a speed higher than that of a plurality of input parallel data signals of the parallel to serial converter.

12. A low to high voltage signal conversion method, comprising:
    providing a low voltage serial data signal to a low voltage transistor, wherein the low voltage serial data signal is provided by a parallel to serial converter and is with a speed higher than that of a plurality of input parallel data signals of the parallel to serial converter;
    providing a bias voltage to a high voltage transistor; and
    sourcing a current from the low voltage transistor to generate a converted signal at one terminal of the high voltage transistor;
    wherein the current flows through a load device, the high voltage transistor, and the low voltage transistor, and voltage of the converted signal is higher than voltage of the low voltage serial data signal, and wherein the high voltage transistor is capable of tolerating higher voltage value between any two terminals of the high voltage transistor than the low voltage transistor.

* * * * *